US005827622A

United States Patent [19]
Coufal et al.

[11] Patent Number: 5,827,622
[45] Date of Patent: Oct. 27, 1998

[54] REFLECTIVE LITHOGRAPHIC MASK

[75] Inventors: Hans Juergen Coufal; Robert Keith Grygier, both of San Jose, Calif.

[73] Assignee: International Business Machines Corporation, Armonk, N.Y.

[21] Appl. No.: 884,094

[22] Filed: Jun. 27, 1997

Related U.S. Application Data

[63] Continuation of Ser. No. 552,027, Nov. 2, 1995, abandoned.

[51] Int. Cl.$^6$ .................................................. G03F 1/00
[52] U.S. Cl. ............................... 430/5; 430/322; 430/326
[58] Field of Search ............................... 430/5, 322, 326; 378/34, 35

[56] References Cited

U.S. PATENT DOCUMENTS

| | | | |
|---|---|---|---|
| 4,964,701 | 10/1990 | Dorschner et al. | 350/347 V |
| 5,052,033 | 9/1991 | Ikeda et al. | 378/34 |
| 5,190,836 | 3/1993 | Nakagawa et al. | 430/269 |
| 5,208,125 | 5/1993 | Lowrey et al. | 430/22 |
| 5,229,255 | 7/1993 | White | 430/311 |
| 5,328,784 | 7/1994 | Fukuda | 430/321 |
| 5,338,647 | 8/1994 | Nakagawa et al. | 430/5 |
| 5,393,623 | 2/1995 | Kamon et al. | 430/5 |
| 5,514,499 | 5/1996 | Iwamatsu et al. | 430/5 |

FOREIGN PATENT DOCUMENTS

| | | | |
|---|---|---|---|
| 61-228447 | 10/1986 | Japan | 430/5 |

OTHER PUBLICATIONS von Bunau, R. et al., "Depth of Focus Enhancement in Optical Lithography", J. Vac. Sci. Technol. B 10(6), Nov./Dec. 1992, pp. 3047–3053.

Owen, G. et al., "1/8 um Optical Lithography", J. Vac. Sci. Technol. B 10(6), Nov./Dec. 1992, pp. 3032–3036.

Lee, Y. H. et al., Silicon on Quartz Reflective Masks for 0.25–um Micro–lithography, J. Vac. Sci. Technol. B 9(6), Nov./Dec. 1991, pp. 3138–3142.

Levenson, M. D., "The Coming Revolution in Photolithography", RJ 9106 (80919) Nov. 18, 1992, Physics.

Hsieh, R. L. et al., "All–Reflective Phase–Shifting Masks for Markie–Dyson Optics", J. Vac. Sci. Technol. B 10(6), Nov./Dec. 1992, pp. 3042–3046.

"Lithography's Leading Edge, Part I: Phase–Shift Technology", Semiconductor International, Feb. 1992, pp. 42–47.

Levenson, M. D., "What IS a Phase–Shifting Mask?", IBM Research Division, K32/802D 650 Harry Rd., San Jose, California 95120.

Levenson, M. D. et al., "Improving Resolution in Photolithography with a Phase–Shifting Mask", IEEE Transactions on Electron Device, vol. ED–29, No. 12, Dec. 1982, pp. 1828–1836.

Mirsalehi, M. M., "Optical Information Processing", Encyclopedia of Physical Science and Technology, vol. 9, ©1987 pp. 658–666 & 511–513.

*Primary Examiner*—Martin Angebranndt
*Attorney, Agent, or Firm*—Robert B. Martin

[57] ABSTRACT

The invention relates to a reflective phase-shifting lithographic mask having a reflective surface comprising a plurality of areas having different refractive indices.

4 Claims, 8 Drawing Sheets

REFLECTIVE LITHOGRAPHIC MASK

This is a continuation of application Ser. No. 08/552,027 filed on Nov. 2, 1995, now abandoned.

The present invention relates to a reflective phase-shifting lithographic mask for use in semiconductor manufacturing.

BACKGROUND OF THE INVENTION

Optical projection exposure tools are now widely used in optical lithography in the production of integrated circuits. The exposure tools generally comprise an electromagnetic light source, a mask and a lens. The tool functions to project the image of the mask onto the surface of a photoresist film disposed on a wafer. Because of the continuing demands for higher circuit density in integrated circuits, there is a continuing desire to improve resolution of optical lithography. One method of improving the resolution involves the use of phase-shifting masks. A transparent phase-shifting mask generally comprises a plurality of individual transparent phase-shifting layers disposed in a pattern on a transparent substrate. Optionally, the phase-shifting mask can also be provided with opaque areas such as a chrome pattern. Light which is focused on the mask will either be reflected by the opaque chrome pattern or be transmitted through the transparent portion of the mask. The phase-shifting layer generally causes the transmitted light to be 180° out of phase with the light which is only transmitted through the transparent substrate, i.e. the non-phase-shifted light, resulting in coherent interaction of the combined phase-shifted and non-phase-shifted light with improved resolution. Phase-shifting masks can be fabricated using standard photolithography techniques. For example, Levenson, et al. in his article "Improving Resolution in Photolithography with Phase-Shifting Mask" IEEE Transaction on Electron Devices Vol. 29, No. 12 (12/82), discloses fabrication of a phase-shifting mask using photolithography with polymethacrylate as the mask material.

Nakagawa U.S. Pat. No. 5,338,647 discloses a reflective phase-shifting mask comprising a reflective surface with first and second regions having relative height differences. Light reflected from the different regions has different phases due to the difference in optical path lengths.

Commercial lithographic masks used in semiconductor manufacturing processes have thousands of features. In order to enhance the resolution of each feature, it is necessary to fabricate phase-shifting elements for each feature. Unfortunately, fabrication of phase-shifting lithographic masks with phase-shifting layers for each feature is cumbersome and expensive. Therefore, there still is a need in the art for a practical phase-shifting mask which can be used in semiconductor manufacturing processes.

It is therefore an object of the present invention to provide an improved phase-shifting lithographic mask.

Other objects and advantages will become apparent from the following disclosure.

SUMMARY OF THE INVENTION

The present invention relates to a reflective phase-shifting mask for lithography having a reflective surface comprising a plurality of reflective areas having different refractive indices. Preferably, the reflective surface is planar. The phase of the light reflected from the surface of the mask will depend on the angle of incident of the light, wavelength and polarization of the light and the complex refractive index of the reflective surface. The different areas on the planar surface will reflect light having different phases resulting in coherent interaction of the reflected light with improved resolution.

A more thorough disclosure of the present invention is presented in the detailed description which follows and from the accompanying drawings in which.

DETAILED DESCRIPTION OF THE INVENTION

The present invention relates to a reflective phase-shifting mask for photoresist lithography having a reflective surface comprising a plurality of areas having different refractive indices. The reflective surface is preferably planar. As used herein refractive indice (N) mean the real number portion and the imaginary number portion. For example, palladium has a refractive index N=1.24+2.74i with light having a wavelength of 365 nm.

Figure 1:
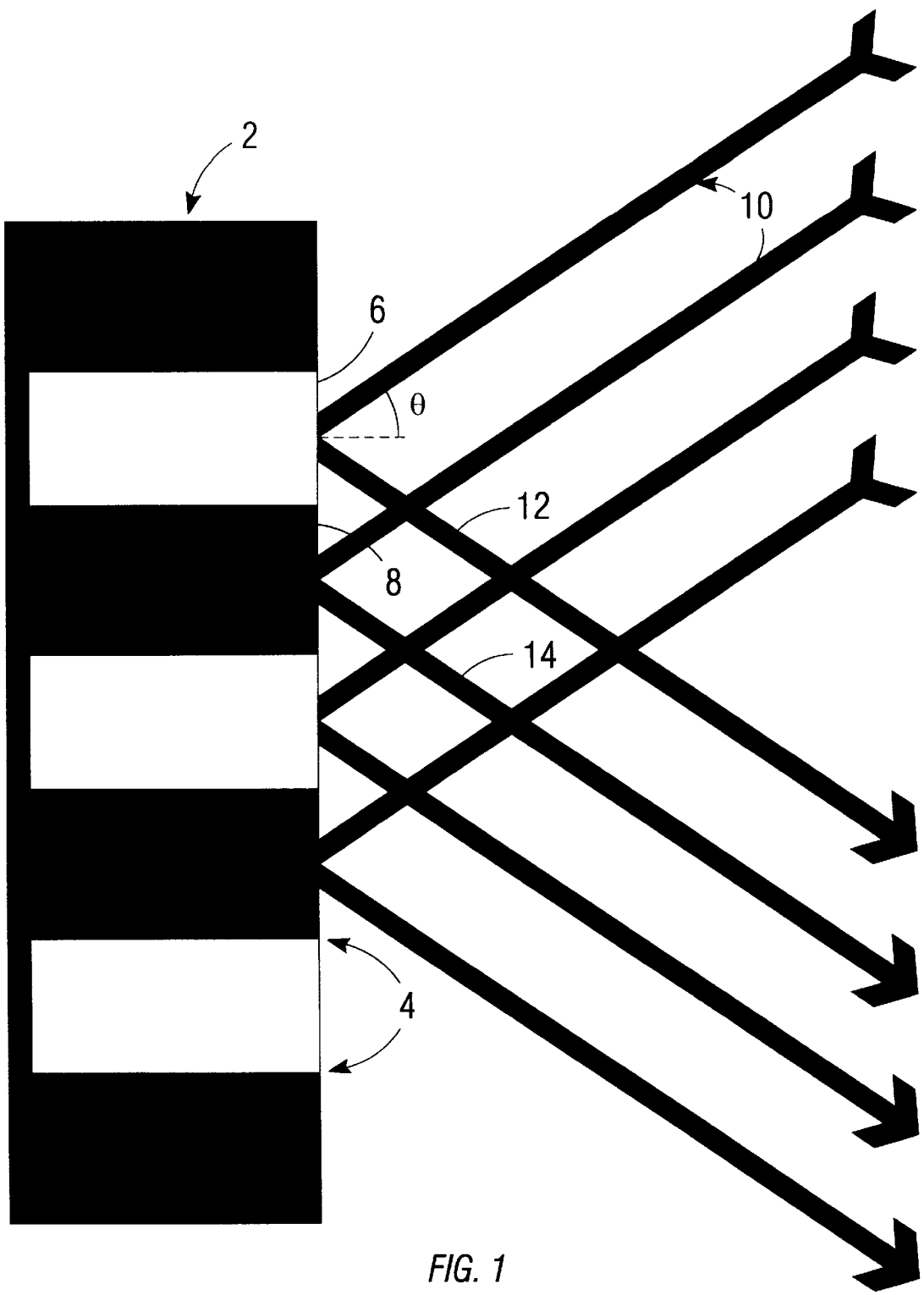
FIG. 1 is a cross-sectional view of an embodiment of the reflective phase-shifting mask of the present invention.

Referring to FIG. 1, there is shown an embodiment of the mask of the present invention. The mask 2 comprises a reflective planar surface 4 comprising a first area 6 and a second area 8 which are contiguous. first and second areas 6 and 8 of the reflective surface 4 of the mask are comprised of materials which have different refractive indices. For example, they can be comprised of silver and gold which have refractive indices of 0.186+1.61i and 1.716+1.862i respectively at 365 nm wavelength. A light beam 10 such as ultraviolet having a uniform wavefront is incident on the reflective planar surface 4 of the mask at an incident angle θ. The reflected beams 12 and 14 are phase-shifted with respect to each other. The degree of phase-shifting is dependent on the incident angle θ, light polarization and the refractive indices of areas 6 and 8 and can be calculated using Maxwell's equation as set forth in Born and Wolf "Principles of Optics" page 628 et seq., the disclosure of which is incorporated herein by reference. Reflected light beams 12 and 14 coherently interact to improve the resolution of the mask.

The coherent interaction of phase-shifted light and improvements in resolution are well known to those skilled in the art such as disclosed in Levenson et al., "Improving Resolution in Photolithography with a Phase-Shifting Mask" IEEE Transactions on Electron Devices Vol. 29, No. 12, (12/82), the disclosure of which is incorporated herein by reference. Generally, it is desired to have 180° phase-shift to cause destructive interference between phase-shifted light and the non-phase-shifted light. However, other degrees of phase-shifting (e.g. 45°, 90° etc.) can also be utilized to improve resolution.

Figure 2:
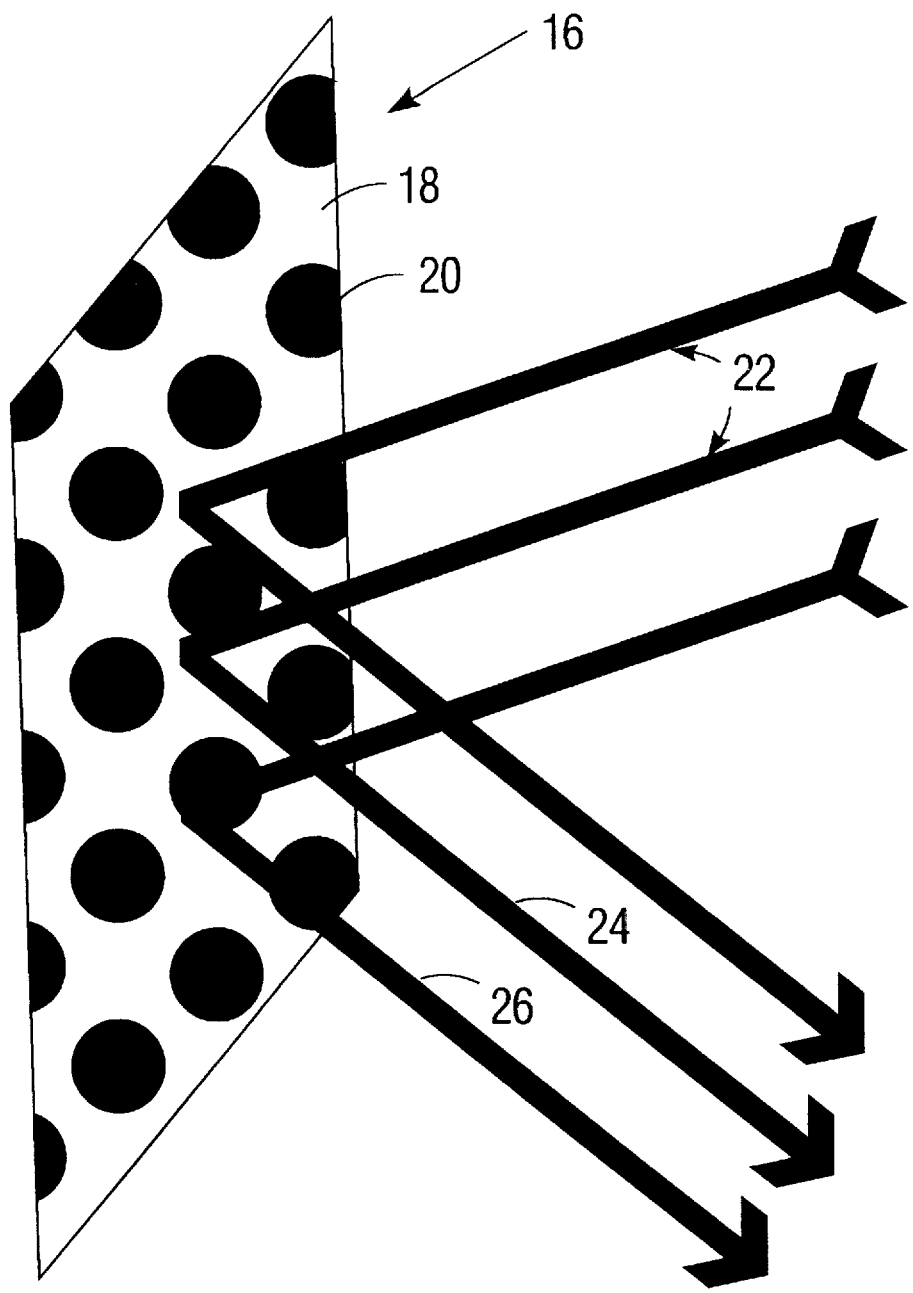
FIG. 2 is a perspective view of another embodiment of the reflective phase-shifting mask of the present invention.

Referring to FIG. 2, there is shown an alternative embodiment of the mask of the present invention. The planar reflective surface 16 comprises a first area 18 and a second area 20. Light beam 22 is incident at an angle on the reflective surface and reflected beams 24 and 26 are phase-shifted with respect to each other to provide improved resolution of the mask. Optionally, the surface area having the higher reflectivity can be coated with a thin layer of light absorbing material to equalize the reflectivity from the reflective areas of the mask.

Suitable materials for forming the reflective surface of the mask of the present invention include metals and alloys such as gold, silver, palladium, chromium, molybdenum, tantalum, ruthenium, nickel and other transition metals and alloys thereof. The reflective surface can also comprise other reflective materials known to those skilled in the art such as organic materials, inorganic materials, semiconductors, dielectrics, polymers, oxides, composites, layered structures and other structural materials (isogel).

The mask of the present invention can be fabricated on a substrate by use of techniques known to those skilled in the art such as lithographic (resist) technology and deposition by known techniques such as chemical vapor deposition, sputtering, thermal evaporation or pulsed laser deposition. The mask can be fabricated on a non-transparent or, preferably, a transparent substrate (e.g. glass, quartz or the like) to ensure the planar character of the reflective surface which is contiguous to the glass. The mask can also optionally be provided with non-reflective areas (e.g. light absorbing areas).

Figure 3:
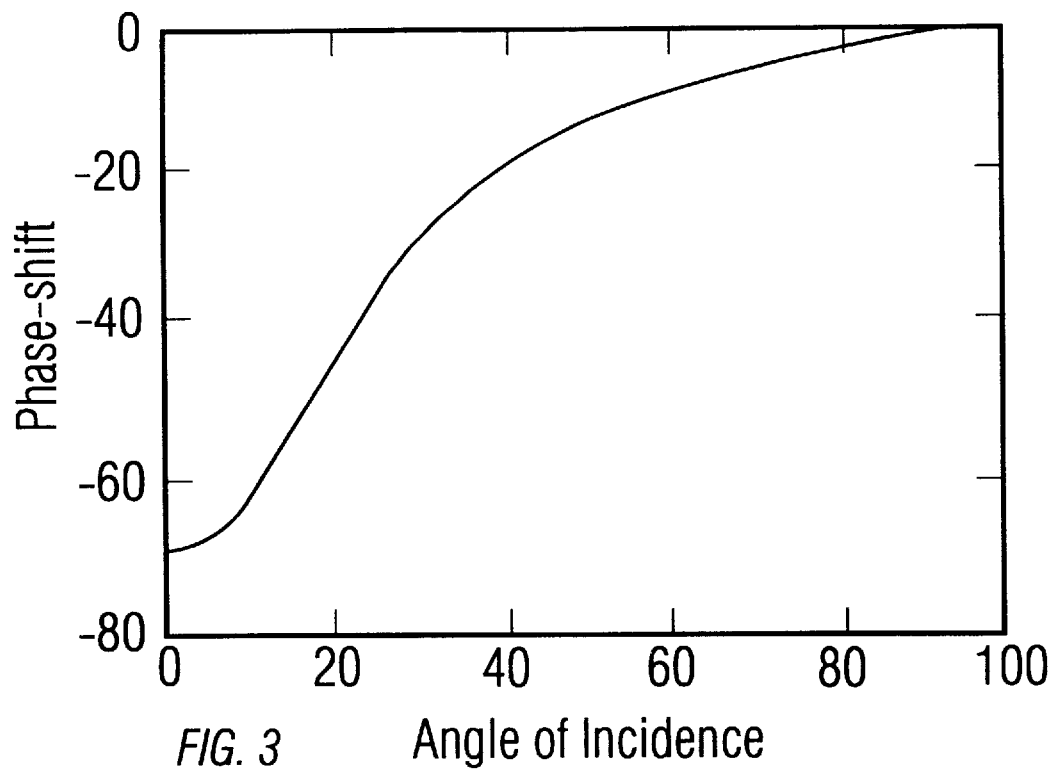
FIGS. 3–14 are graphs of the degree of phase-shifting of reflected light as a function of incident angle for different reflective materials.
Figure 4:
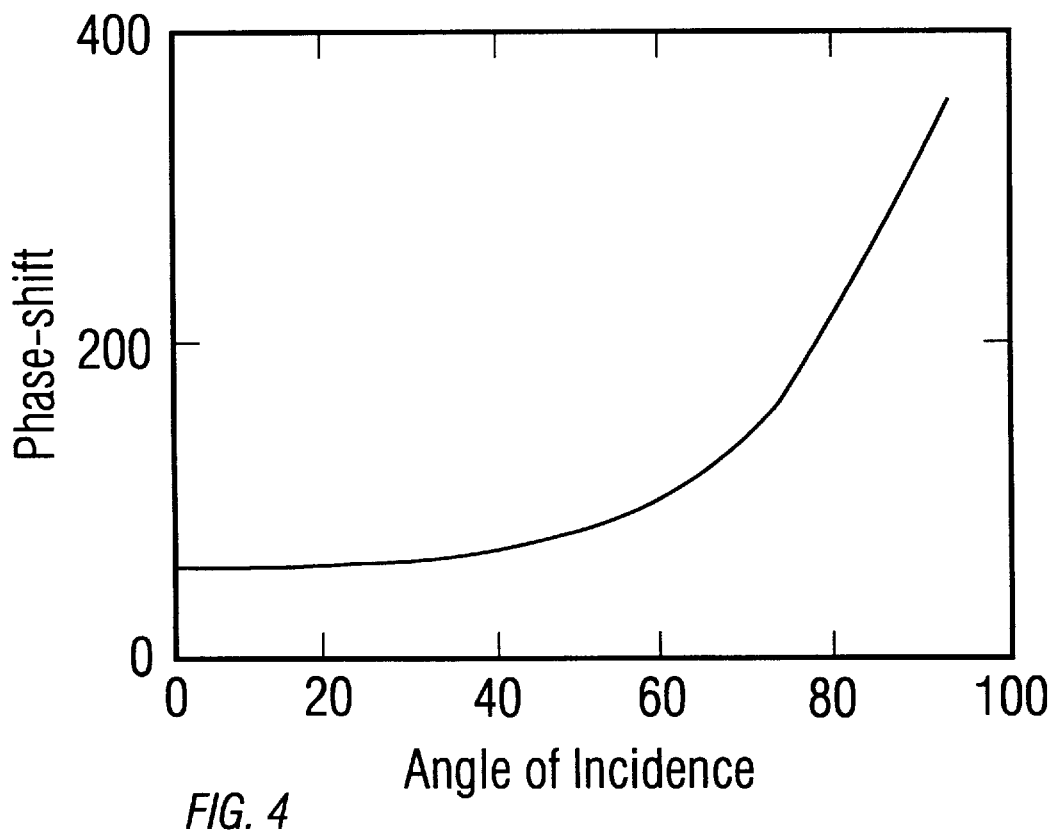
Figure 5:
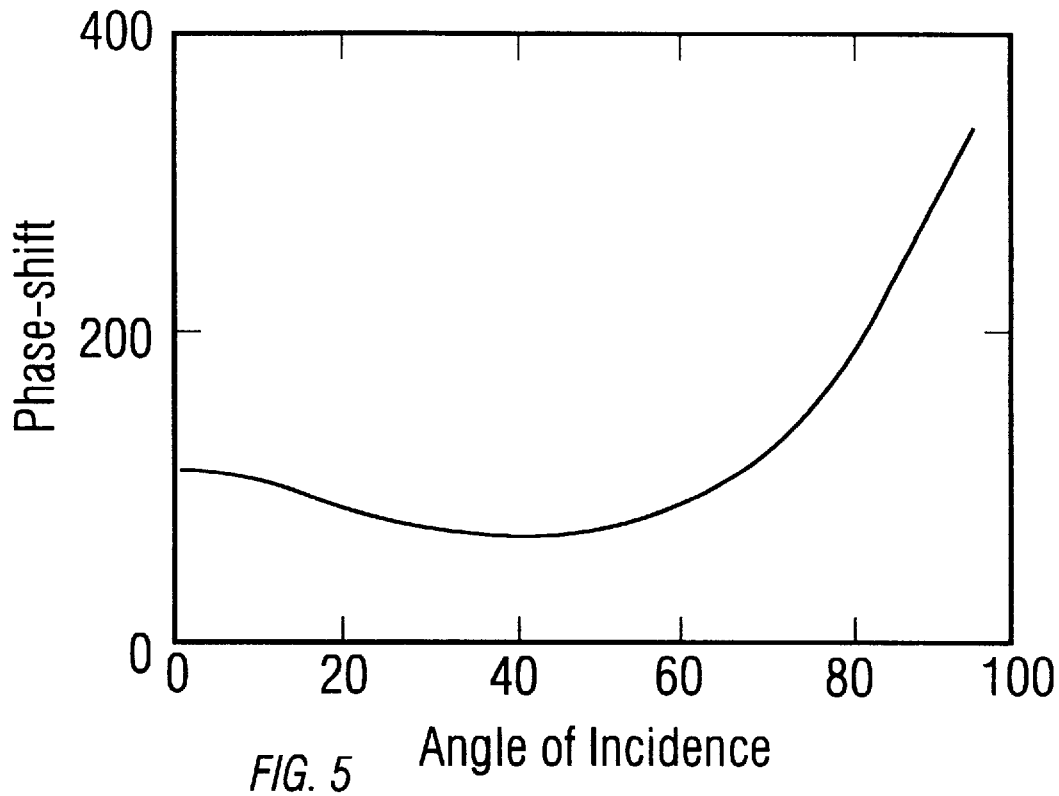

Referring to FIG. 3, there is shown a graph of the amount of phase-shifting (in degrees) of incident parallel polarized light (at 365 nanometers (nm)) reflected off a planar silver surface as a function of angle of incident θ of the light on the reflecting silver surface. Generally, the imaginary part of the refractive index has little influence on the phase-shifting of the reflected light. FIG. 4 shows a graph of the degrees of phase-shifting of reflected parallel polarized 365 nm light for gold as a function of incident angle. FIG. 5 shows a graph of the difference in phase-shifting of gold minus silver (FIG. 4–FIG. 3) as a function of incident angle for parallel polarized incident light at 365 nm. FIG. 5 shows a 180° phase-shift of light reflected off gold relative to the light reflected off silver at an incident angle θ of about 75°. A reflective phase-mask of the present invention comprising a planar reflective surface having areas of gold and silver can achieve 180° phase-shift of reflected light utilizing an incident parallel polarized 365 nm light with an incident angle of 75°.

Figure 6:
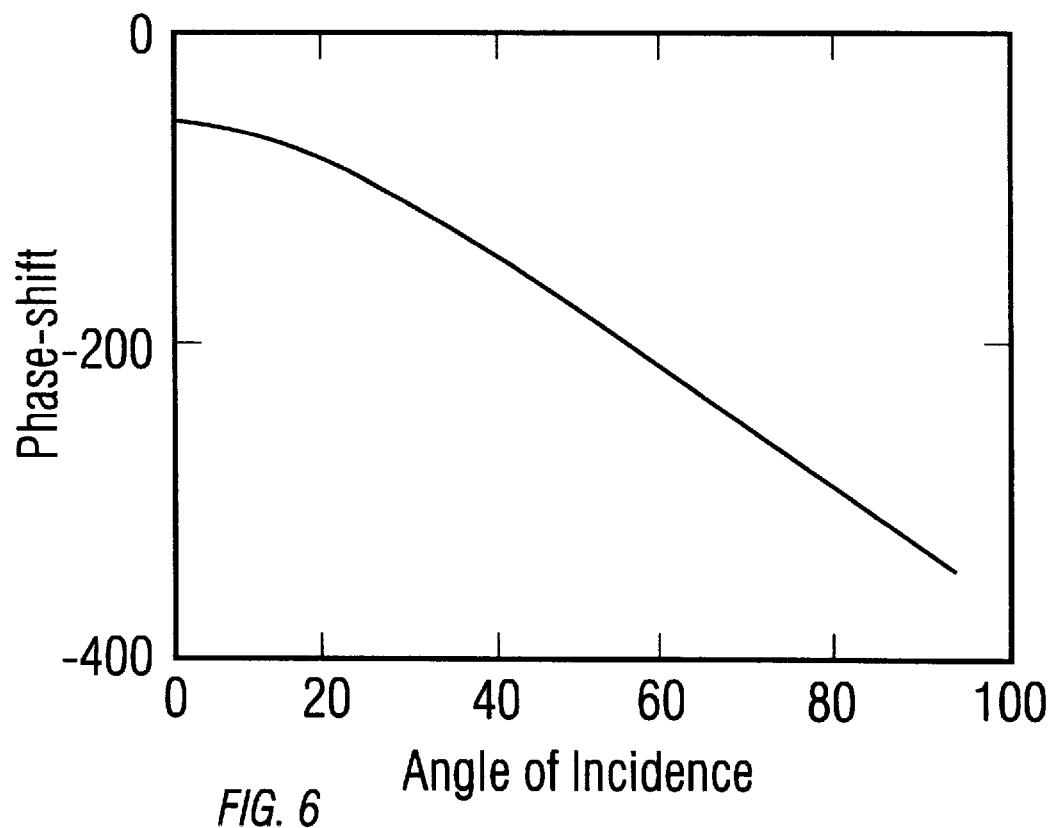
Figure 7:
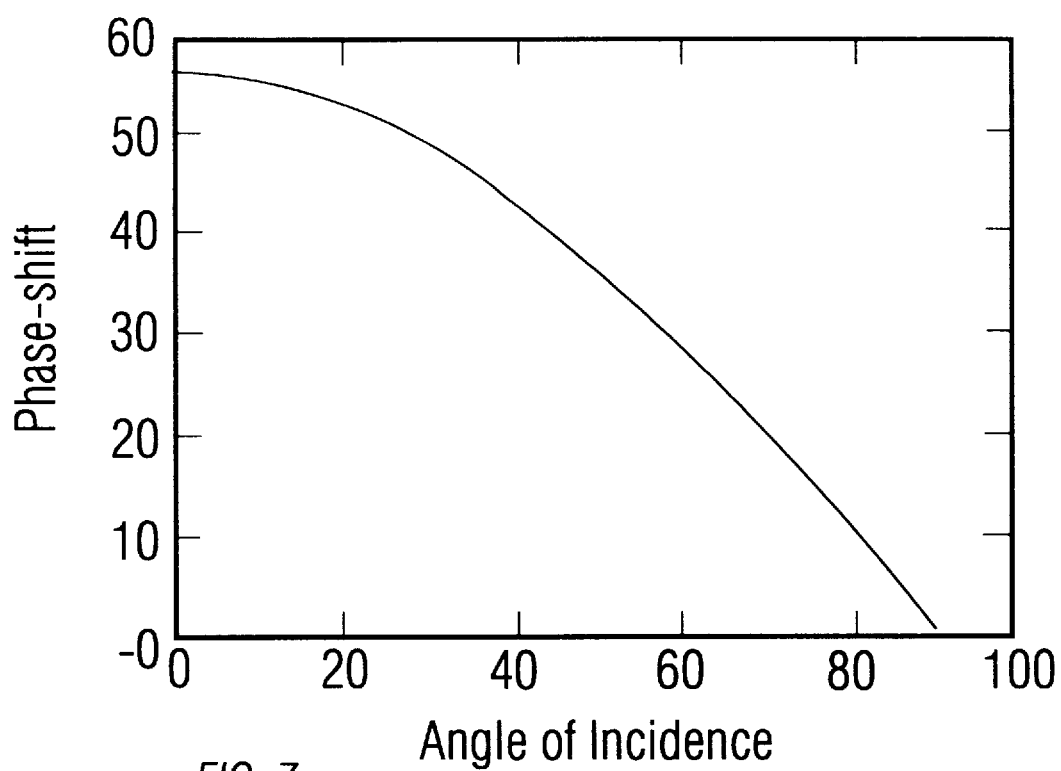
Figure 8:
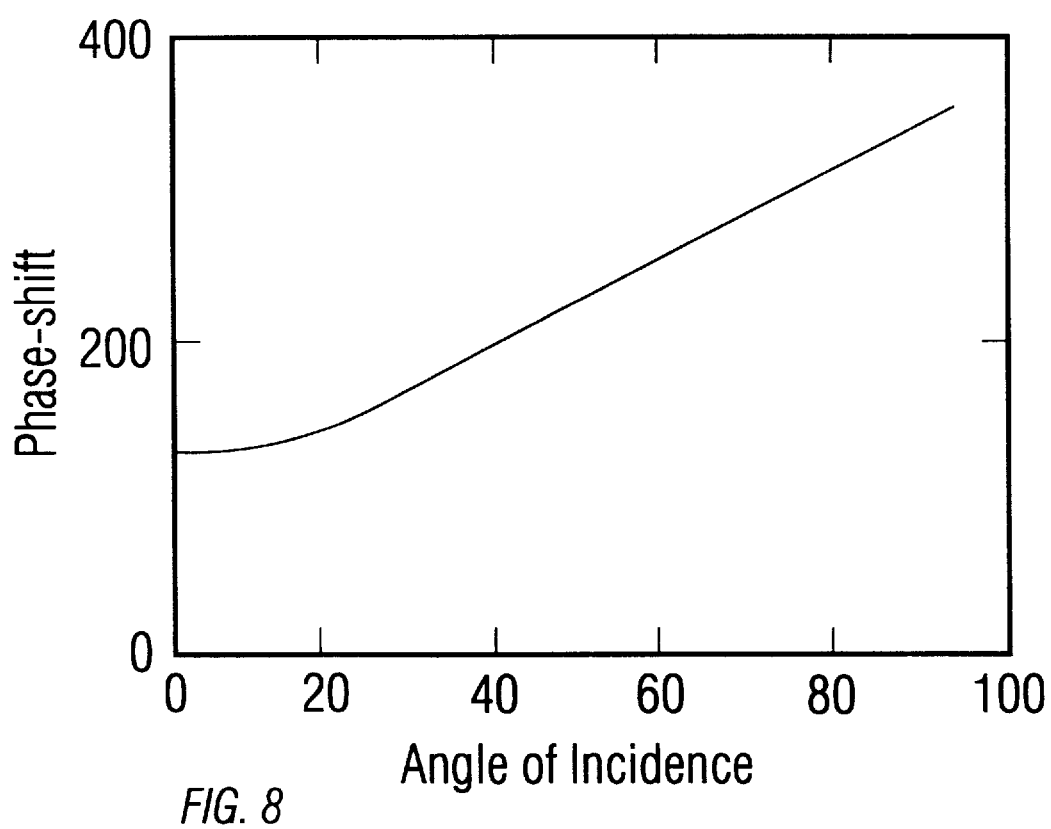

FIG. 6 shows a graph of the phase-shifting of silver as a function of angle of incident for perpendicular polarized 365 nm light. FIG. 7 shows a of the phase-shifting of gold as a function of incident angle for perpendicular polarized 365 nm light. FIG. 8 shows a graph of the difference in phase-shifting of gold minus silver as a function of incident angle for perpendicular polarized incident light at 365. A 180° phase-shift occurs at about 36° incident angle.

Figure 9:
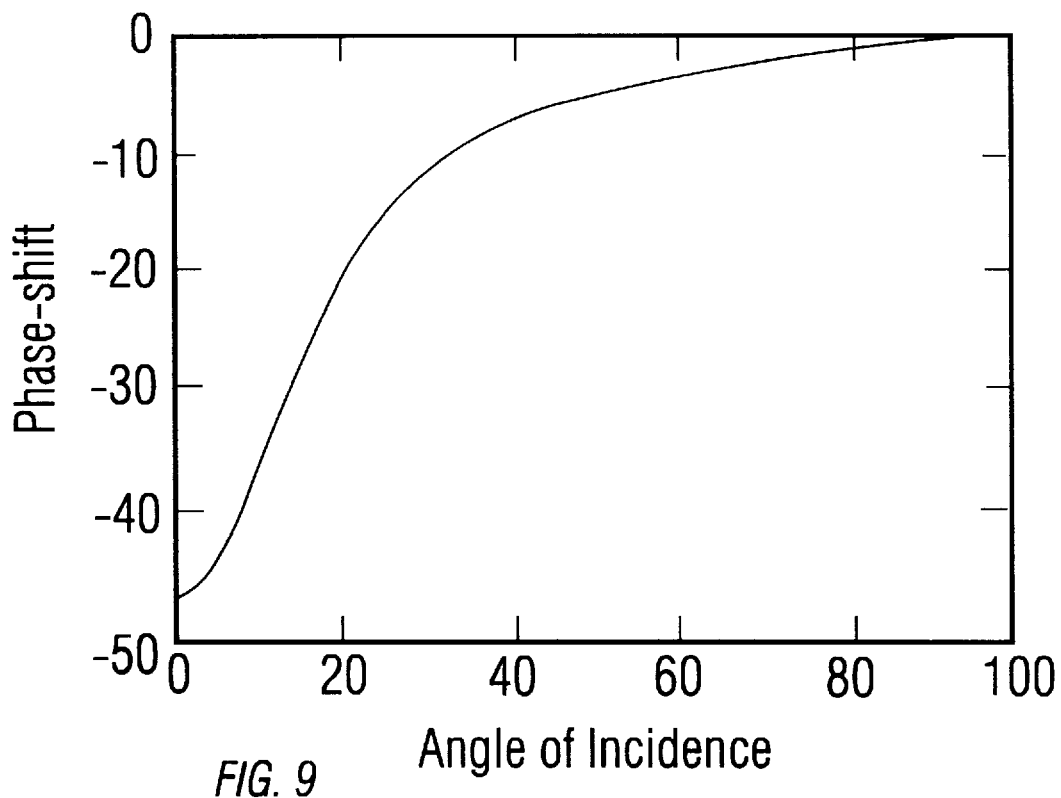

FIG. 9 shows a graph of phase-shifting verse incident angle for a reflective mask on a quartz substrate (refractive index=1.475) with incident parallel polarized 365 nm light passing through the quartz to reflect off the underlying planar reflective silver surface.

Figure 10:
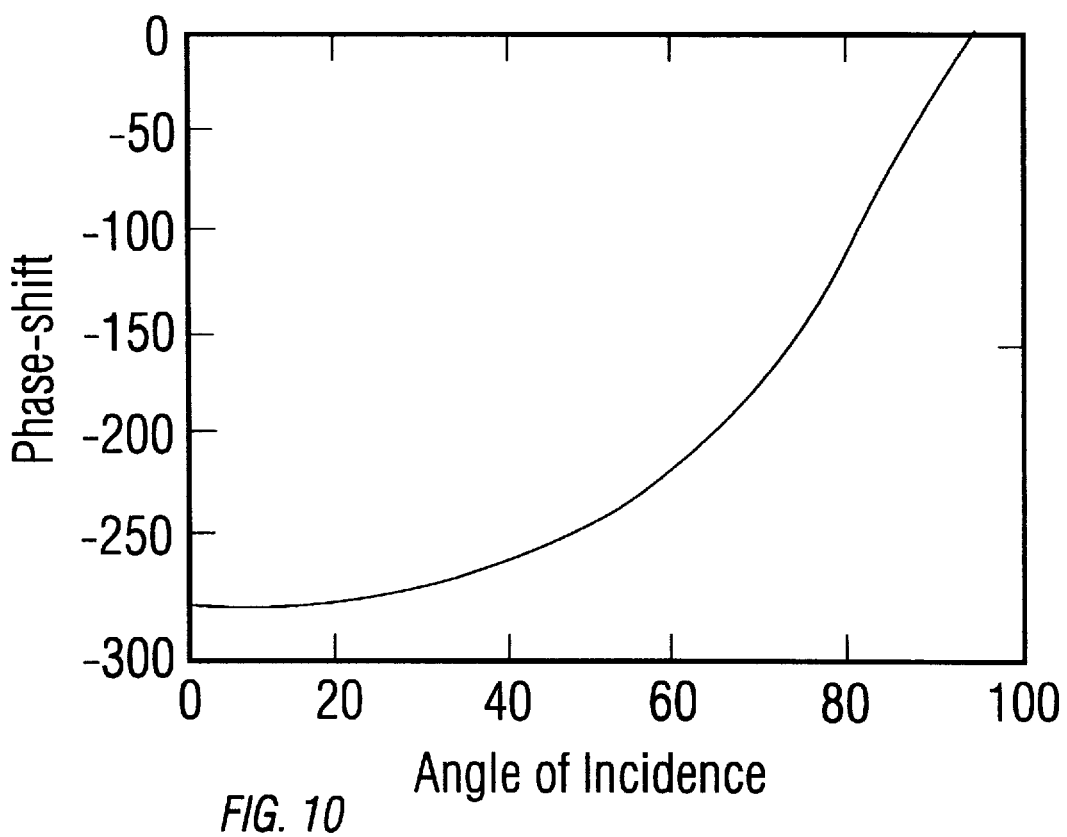

FIG. 10 shows a graph of phase-shift verse incident angle for a gold reflective mask on a quartz substrate with parallel polarized incident light at 365 nm.

Figure 11:
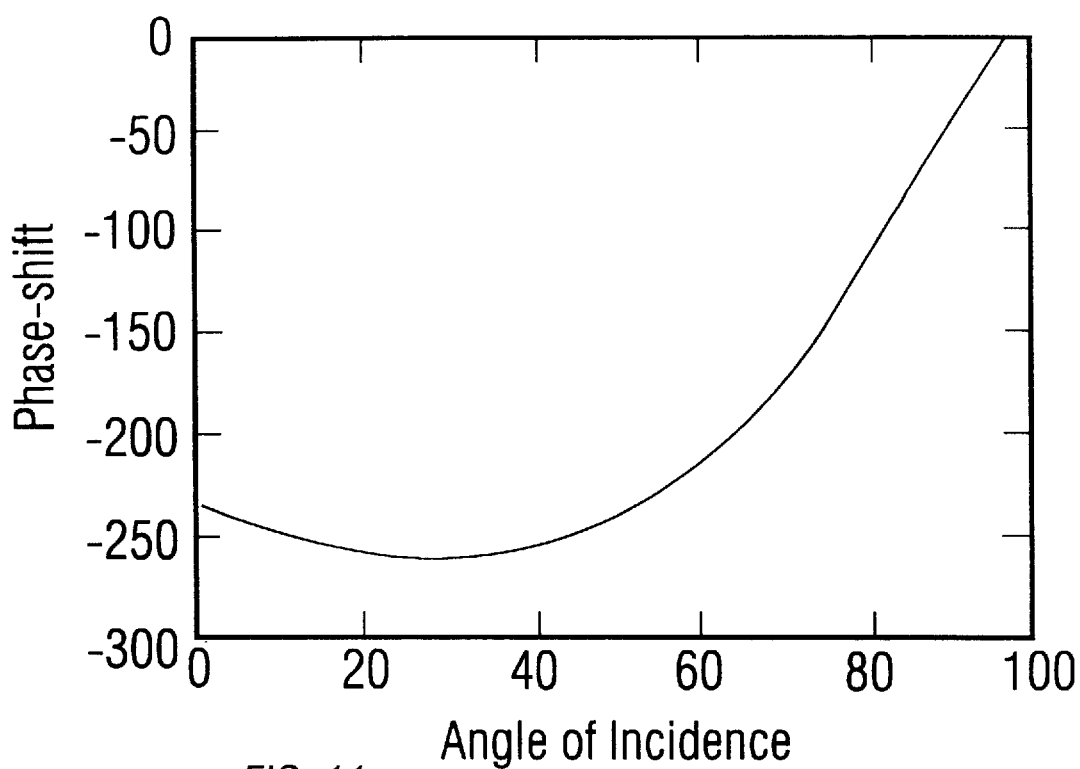

FIG. 11 shows a graph of difference in phase-shifting of gold minus silver as a function of incident angle for a reflective mask on a quartz substrate with parallel polarized incident light at 365 nm. A 180° phase-shift occurs at about 63° incident angle.

Figure 12:
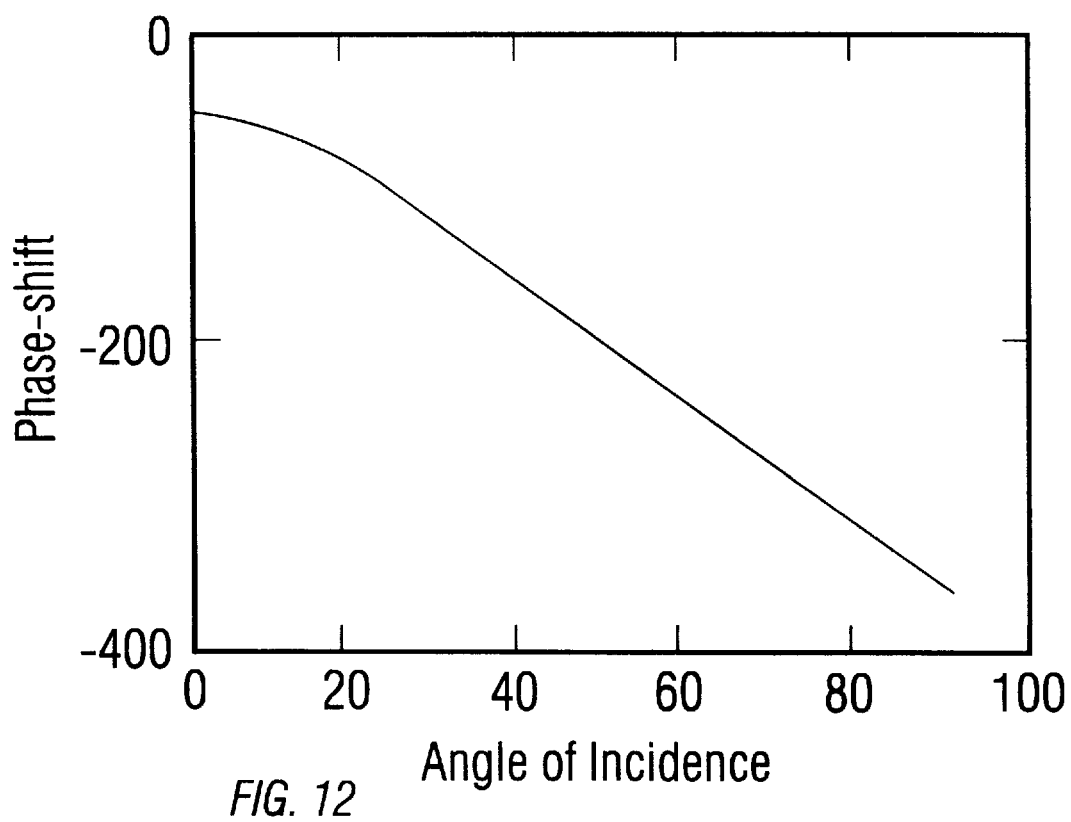

FIG. 12 shows a graph of phase-shifting verse incident angle for a reflective mask on a quartz substrate with incident perpendicular polarized 365 nm light passing through the quartz to reflect off the underlying planar reflective silver surface.

Figure 13:
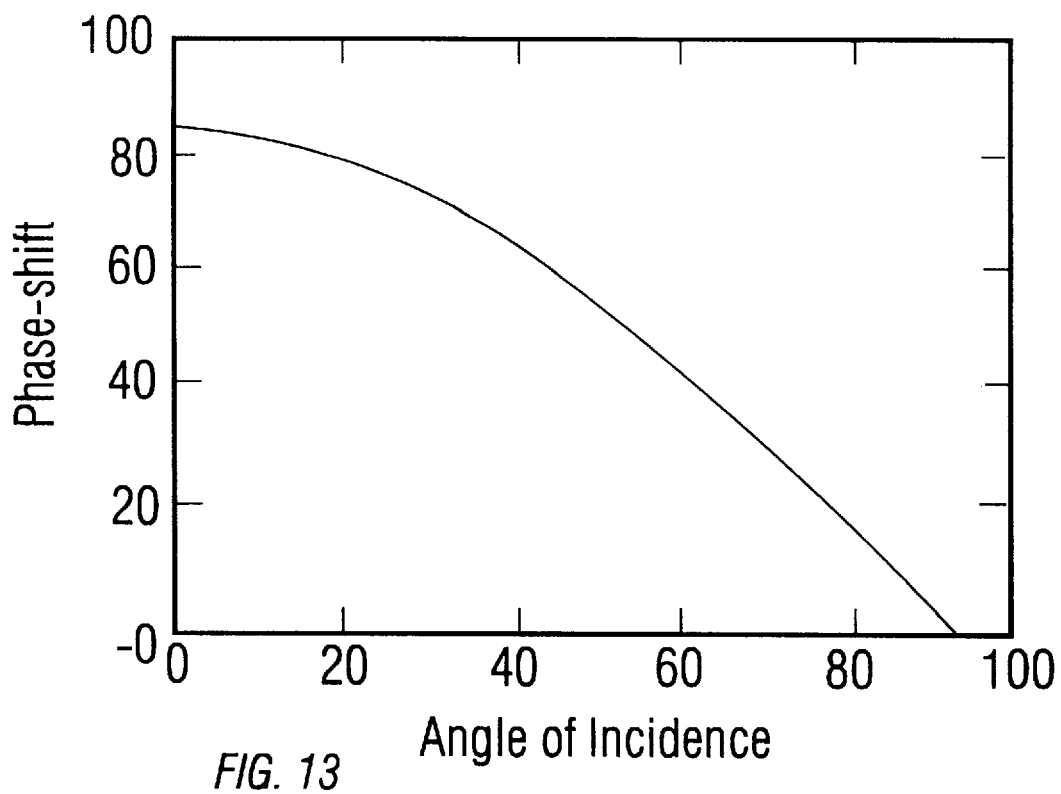

FIG. 13 shows a graph of phase-shift verse incident angle for a gold reflective mask on a quartz substrate with perpendicular polarized incident light at 365 nm.

Figure 14:
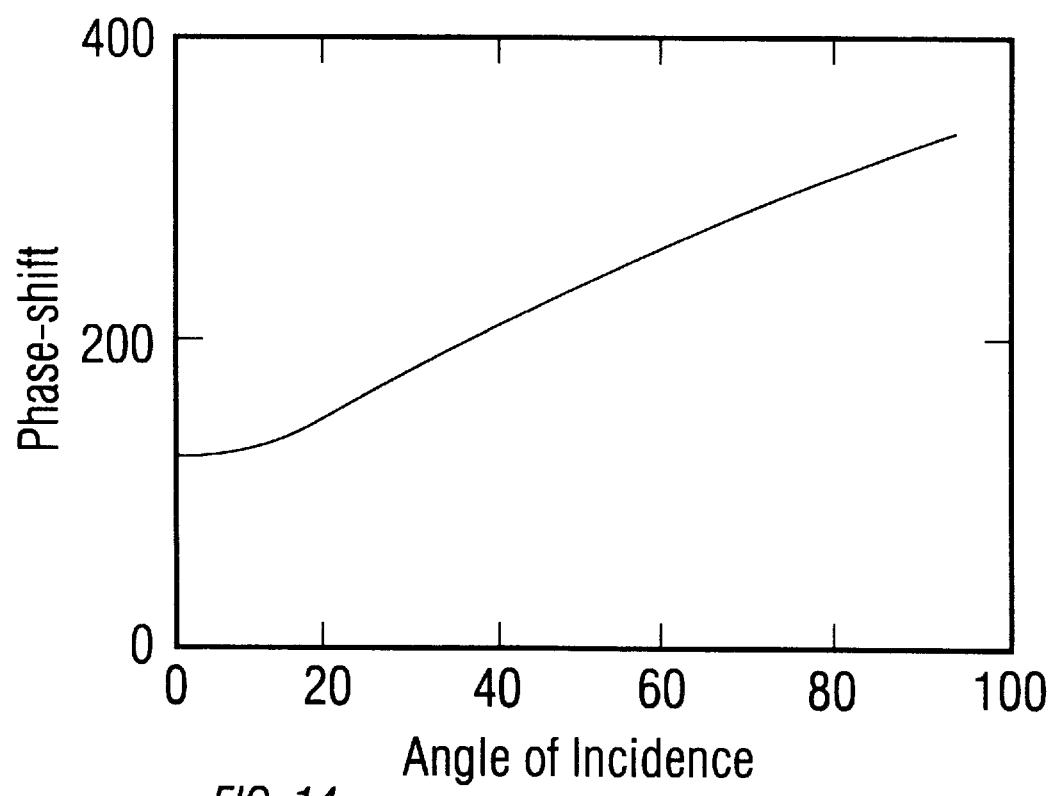

FIG. 14 shows a graph of difference in phase-shifting of gold minus silver as a function of incident angle for a reflective mask on a quartz substrate with perpendicular polarized incident light at 365 nm. A 180° phase-shift occurs at about 25° incident angle.

The present invention also relates to a process for generating a resist image on a substrate utilizing the mask of the present invention comprising the steps of: (a) coating a substrate with a film comprising a radiation sensitive resist composition; (b) imagewise exposing the film to radiation reflected off the mask of the present invention, and (c) developing the image.

The first step involves coating a substrate with a film comprising a radiation sensitive resist composition dissolved in a suitable solvent. Suitable substrates are comprised of silicon, ceramics or the like. Suitably, the surface of the substrate is cleaned by standard procedures before the film is disposed thereon.

A variety of radiation sensitive resists can be utilized in the process of the present invention. Suitable resist include diazonaphthoquinone/novolac and Apex resist sold by IBM. Other suitable radiation sensitive resists will be known to those skilled in the art. The film can be coated on the substrate using art-known techniques such as spin or spray coating, or doctor blading. Preferably, before the film is exposed to radiation, the film is heated to an elevated temperature for a short period of time to remove solvent.

In the second step of the process, the film is imagewise exposed to radiation, suitably electromagnetic, preferably electromagnetic radiation such as ultraviolet suitably at a wavelength of about 190–365 nm, preferably 254–365 nm. Suitable radiation sources include mercury, mercury/xenon, xenon lamps, ArF excimer or KrF excimer.

The imagewise exposure of the film is accomplished by reflecting incident light off the reflective surface of the mask of the present invention to enhance resolution of the image on the film.

The third step of the process involves development of a positive or negative resist image using a suitable solvent known to those skilled in the art.

The resist image can be utilized in semiconductor manufacturing process such as forming a circuit in the developed film on the substrate using art known techniques.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

we claim:

1. A process for generating a resist image on a substrate comprising the steps of:

(a) coating a substrate with a film comprising a radiation sensitive resist;

(b) imagewise exposing the film to radiation reflected off a planar reflective metal surface comprising a plurality of areas having different refractive indices, the radiation reflected from one portion of the planar reflective metal surface being phase shifted at 45°, 90° or 180° from radiation reflected other portions of the planar reflective metal surface; wherein the planar reflective metal surface is tilted so that the radiation is incident upon it from about 25° to about 75° from the normal; and (c) developing the image.

2. The process of claim 1 wherein the reflective surface is disposed on a transparent planar substrate.

3. The process of claim 2 wherein the transparent planar substrate is glass or quartz.

4. The process of claim 1 wherein the areas having different refractive are comprised of gold, silver, palladium, chromium, molybdenum, tantalum, ruthenium, nickel or alloys thereof.

* * * * *